(12) United States Patent
Dai et al.

(10) Patent No.: US 11,178,783 B2
(45) Date of Patent: Nov. 16, 2021

(54) ARC-SHAPED LOCK

(71) Applicant: UNILUMIN GROUP CO., LTD, Guangdong (CN)

(72) Inventors: Xiaotian Dai, Guangdong (CN); Jinxing Li, Guangdong (CN)

(73) Assignee: UNILUMIN GROUP CO., LTD, Shenzhen (CN)

( * ) Notice: Subject to any disclaimer, the term of this patent is extended or adjusted under 35 U.S.C. 154(b) by 44 days.

(21) Appl. No.: 16/794,182

(22) Filed: Feb. 18, 2020

(65) Prior Publication Data
US 2020/0352043 A1 Nov. 5, 2020

(30) Foreign Application Priority Data
May 5, 2019 (CN) .......................... 201920639140.1

(51) Int. Cl.
*H05K 7/00* (2006.01)
*H05K 5/02* (2006.01)
*H05K 5/00* (2006.01)

(52) U.S. Cl.
CPC ......... *H05K 5/0221* (2013.01); *H05K 5/0021* (2013.01); *H05K 5/023* (2013.01); *H05K 5/0017* (2013.01)

(58) Field of Classification Search
USPC ....................................................... 361/747
See application file for complete search history.

(56) References Cited

FOREIGN PATENT DOCUMENTS

| CN | 105575273 A | | 5/2016 | |
|---|---|---|---|---|
| CN | 106640873 A | | 5/2017 | |
| CN | 207651096 U | | 7/2018 | |
| CN | 207660944 | * | 7/2018 | ................ F16B 5/00 |
| CN | 108386662 | * | 10/2018 | ............. F16M 11/02 |
| CN | 108775313 | * | 11/2018 | ................ F16B 5/10 |
| CN | 209625674 | * | 11/2019 | ............... G09F 9/33 |

OTHER PUBLICATIONS

Search report of counterpart European Patent Application No. 20159512.1 dated Aug. 28, 2020.

\* cited by examiner

*Primary Examiner* — Hung S. Bui

(57) ABSTRACT

Disclosed is an arc-shaped lock. The arc-shaped lock includes an adjusting mechanism and a fixing mechanism, the adjusting mechanism includes a sliding shaft fastened to a first LED box, and a cover sleeving on the sliding shaft, the sliding shaft sliding in the cover in an arc track. And the fixing mechanism includes a lock seat fastened to a second LED box adjacent to the first LED box, a handle assembly, and a connecting assembly configured to connect the lock seat with the cover under a control of the handle assembly. The present disclosure aims to adopt the arc-shaped lock to fixedly install two adjacent LED panels together, for improving an user experience and a safety factor of the installation.

19 Claims, 4 Drawing Sheets

ARC-SHAPED LOCK

CROSS REFERENCE TO RELATED APPLICATIONS

The present application claims the benefit of Chinese Patent Application No. 201920639140.1 filed on May 5, 2019, the contents of which are incorporated herein by reference in their entirety.

TECHNICAL FIELD

The present disclosure relates to the technical field of assembly of LED display screens, in particular to an arc-shaped lock.

BACKGROUND

With the rapid development of LED display industry, there are more and more new products on the market, such as, fixed screen, stage screen, rental screen, TV screen, and so on. The rental screen, often used in activities for commercial publicity and stage performance, is much more popular due to its advantages, such as quick assembly and disassembly, quick maintenance, and application of arc structure. In detail, the rental screen can be hoisted or fixed on somewhere, or installed on the ground. In this condition, the customers' experience of installing LED panels (namely, display units) of the LED display screen together is particularly important.

SUMMARY

The main purpose of the present disclosure is to provide an arc-shaped lock, which aims at applying arc-shaped structure to fixedly install two adjacent LED panels of LED display screen together, to improve user's installation experience.

In order to achieve the above objective, the present disclosure provides an arc-shaped lock including an adjusting mechanism and a fixing mechanism, the adjusting mechanism includes a sliding shaft fastened to a first LED panel, and a cover sleeving on the sliding shaft, the sliding shaft sliding in the cover in an arc track. And the fixing mechanism includes a lock seat fastened to a second LED panel adjacent to the first LED panel, a handle assembly, and a connecting assembly configured to connect the lock seat with the cover under a control of the handle assembly.

In some embodiments, the lock seat is fastened to the LED panel through a screw structure.

In some embodiments, the handle assembly includes a handle and a safety structure for locking the handle, one end of the handle being rotatably connected with the lock seat. And the safety structure for locking the handle including an elastic clamping block arranged at one end of the handle adjacent to the lock seat, and the elastic clamping block is configured to lock the handle through an elastic reset effect.

In some embodiments, one end of the cover adjacent to the lock seat includes an arc-shaped clamping groove. And one end of the connecting component is drivingly connected with one end of the handle, and the other end of the connecting component is clamped and fit in the arc-shaped clamping groove.

In some embodiments, when the elastic clamping block is unlock the handle, one end of the handle is enable to rotate around the lock seat, until the connecting assembly is clamped in the arc-shaped clamping groove.

In some embodiments, the sliding shaft includes an arc-shaped rod, and a mounting part connected with one end of the arc-shaped rod, and fastened on the first LED panel through a screw structure.

In some embodiments, the cover includes an arc-shaped sliding groove for receiving the arc-shaped rod.

In some embodiments, the adjusting mechanism includes a graduated positioning screw assembly arranged at an outside of the cover; and the arc-shaped rod includes an arc-shaped groove, the graduated positioning screw assembly being clamped and fit in the arc-shaped groove for locking the arc-shaped rod.

In some embodiments, two sides of the arc-shaped sliding groove includes one arc-shaped and graduated groove; and the arc-shaped rod includes a connecting rod at an end of the arc-shaped rod adjacent to the mounting part, the connecting rod being slidably clamped and fit in two arc-shaped and graduated grooves.

In some embodiments, the arc-shaped and graduated groove includes seven graduations of $-15°$, $-10°$, $-5°$, $0°$, $5°$, $10°$ and $15°$.

In some embodiments, the cover includes a positioning button assembly arranged on an outside of cover; and the arc-shaped rod is arranged with positioning holes, the positioning button assembly being clamped and fit in corresponding positioning hole.

In some embodiments, the sliding shaft includes an arc-shaped rod; and the cover includes an arc-shaped sliding groove for receiving the arc-shaped rod, one side of the arc-shaped rod facing the arc-shaped sliding groove being arranged with graduated positioning holes.

In some embodiments, the side of the arc-shaped rod facing the arc-shaped sliding groove is arranged with seven graduated positioning holes.

In the installation process of the LED display screen, for the arc-shaped lock provided by the present disclosure, it only needs to fasten the lock seat to a first LED box. The sliding shaft of the adjusting mechanism is fastened to a second LED box. And then a connecting assembly configured to connect the lock seat with a cover under a control of the handle assembly. Because the cover sleeving on the sliding shaft, the sliding shaft sliding in the cover in an arc track. Thus it realizes the application and the installation operation of the arc between two adjacent LED panels of the LED display screen. And the misoperation can be prevented by the handle, so that the experience and safety factor of arc installation are multiplicative.

BRIEF DESCRIPTION OF THE DRAWINGS

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present invention without creative efforts shall fall within the protection scope of the present invention.

DETAILED DESCRIPTION OF THE EMBODIMENTS

As following, the technical solution in the embodiments of the present disclosure will be described clearly and completely with reference to the drawings in the embodiment of the present disclosure. Obviously, the described embodiment is only a part of the embodiment of the present disclosure, not all of the embodiments. Based on the embodiments in the present disclosure, all other embodiments perceived by those ordinary skills in the art without creative effort should be fallen within the protection scope of the present disclosure.

Figure 1:
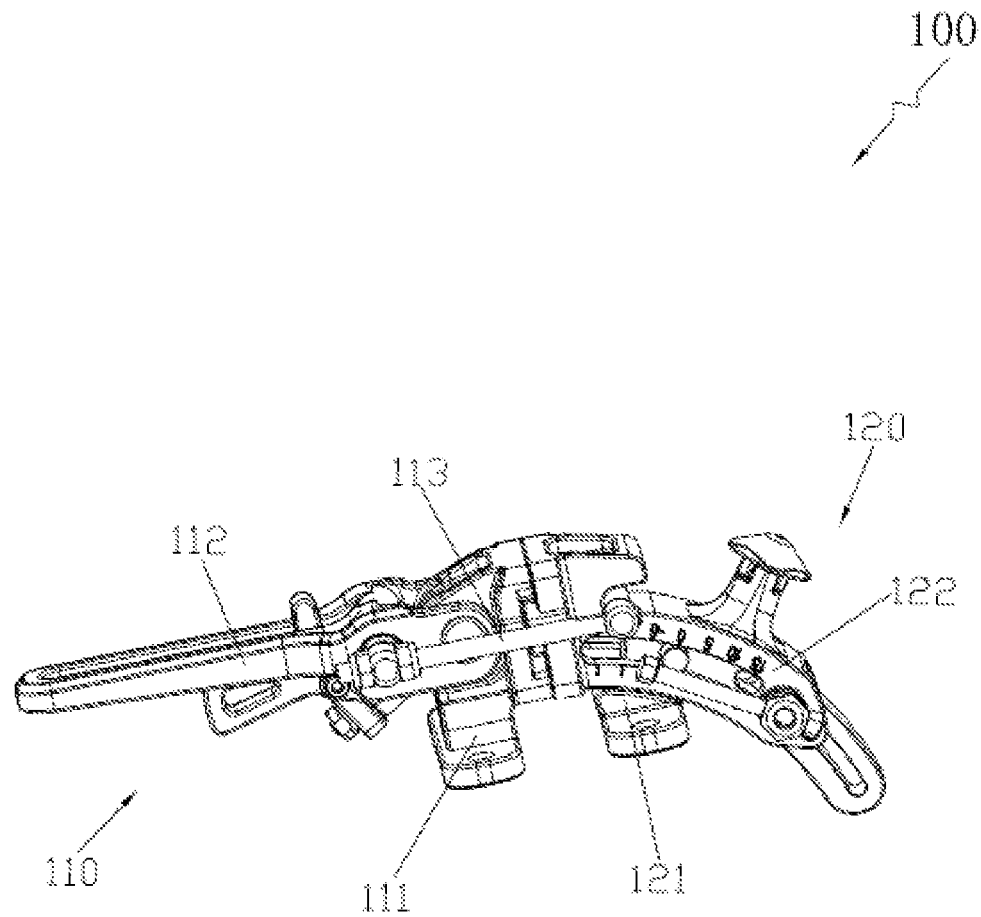
FIG. 1 is a structural schematic diagram of an arc-shaped lock according to an embodiment of the present disclosure.
Figure 2:
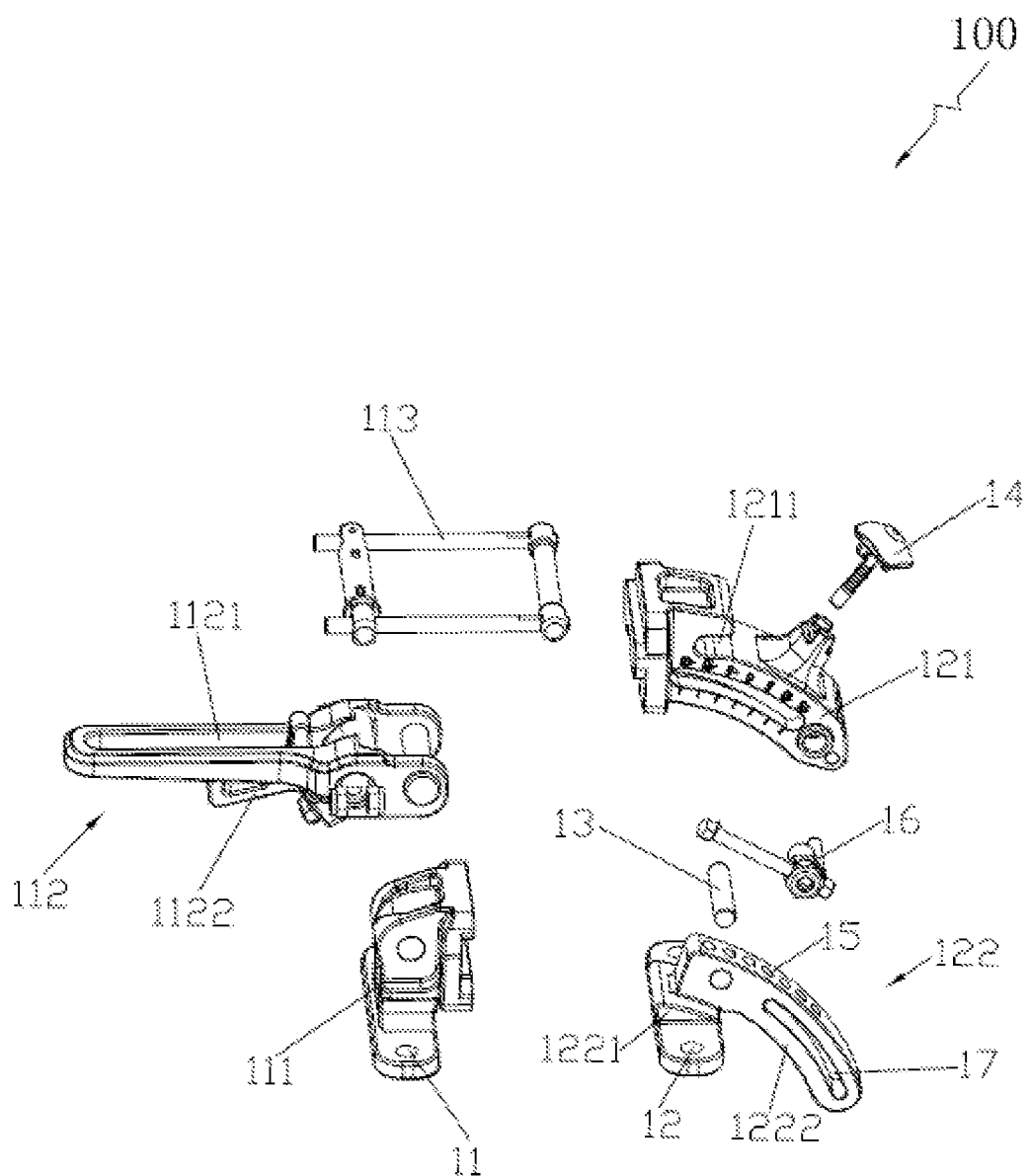
FIG. 2 is an exploded diagram of the arc-shaped lock according to FIG. 1.
Figure 4:
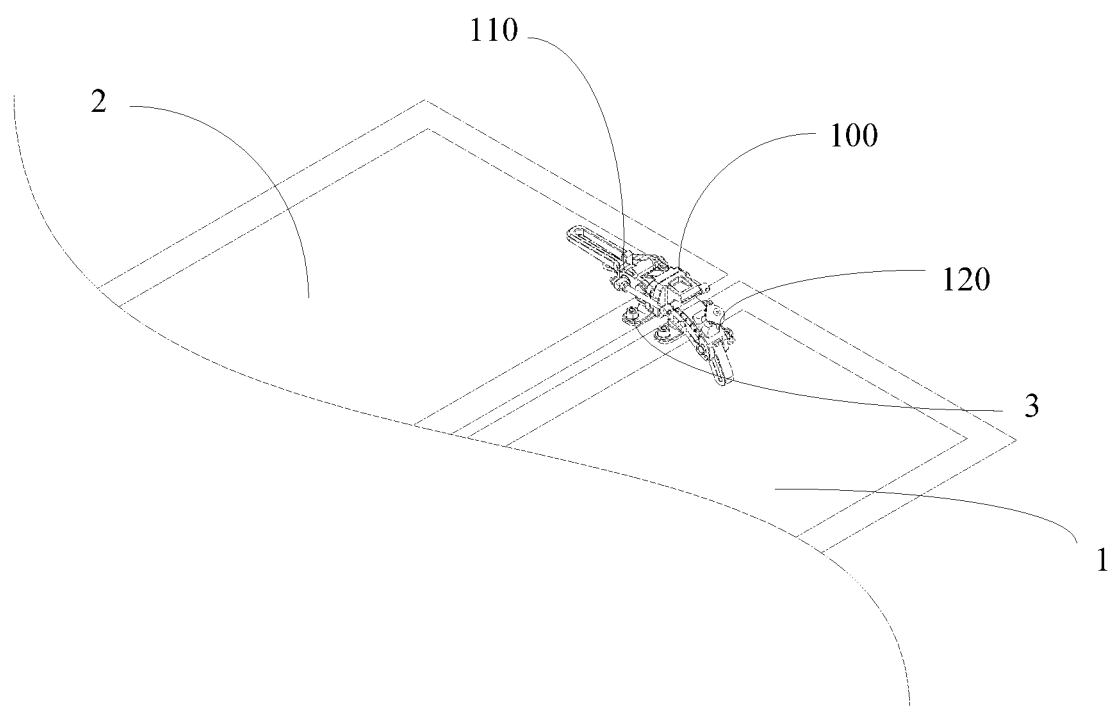
FIG. 4 is a schematic diagram showing the arc-shaped lock locking a first LED box and a second LED box according to an embodiment of the present disclosure.

As shown in FIGS. 1, 2 and 4, the embodiment of the present disclosure provides an arc-shaped lock 100, which includes a fixing mechanism 110 and an arc-shaped adjusting mechanism 120. The fixing mechanism 110 includes an arc-shaped lock seat 111, a handle assembly 112 and a connecting assembly 113. And the arc-shaped adjusting mechanism 120 includes an arc-shaped cover 121 and an arc-shaped sliding shaft 122. When two adjacent LED panels (namely, two adjacent display units or two adjacent display boxes 1, 2) of the LED display screen need to be installed together through the arc-shaped lock 100, the sliding shaft 122 is fastened to a first LED box 1, the arc-shaped lock seat 111 is fastened to a second LED box 2 adjacent to the first LED box 1, the connecting assembly 113 is configured to connect the arc-shaped lock seat 111 with the arc-shaped cover 121 under a control of the handle assembly 112, and the arc-shaped cover 121 is sleeving on the sliding shaft 122. The sliding shaft 122 is slidable in the arc-shaped cover 121 in an arc track.

In the embodiment, as shown in FIG. 2, the arc-shaped lock seat 111 is arranged with a screw mounting hole 11 cooperated with a screw structure (3) to fasten the arc-shaped lock seat 111 with the LED box. The handle assembly 112 specifically includes a handle 1121 and a safety structure 1122 for locking the handle 1121. One end of the handle 1121 is rotatably connected with the arc-shaped lock seat 111. The safety structure 1122 includes an elastic clamping block arranged at one end of the handle 1121 adjacent to the arc-shaped lock seat 111 and configured to lock the handle 1121 through an elastic reset effect. In addition, one end of the arc-shaped cover 121 adjacent to the arc-shaped lock seat 111 includes an arc-shaped clamping groove 1211, one end of the connecting component 113 is drivingly connected with one end of the handle 1121, and the other end of the connecting component 113 is clamped and fit in the arc-shaped clamping groove 1211, so that the connecting assembly 113 is configured to connect the arc-shaped lock seat 111 and the arc-shaped cover 121 under the control of the handle assembly 112. In this way, when the elastic clamping block is pulled outwards to unlock the handle 1121, one end of the handle 1121 can be controlled to rotate around the arc-shaped lock seat 111, so that the other end of the connecting assembly 113 is clamped in the arc-shaped clamping groove 1211. So that the connecting assembly 113 is configured to connect the arc-shaped lock seat 111 with the arc-shaped cover 121 under a control of the handle assembly 112. Finally, the elastic clamping block is released to re-lock the handle 1121 through the elastic reset effect of the elastic clamping block. At this time, the handle 1121 cannot be moved to avoid the handle 1121 from loosening and failing, or from loosening due to a misoperation. As such the display screens cannot be fastened together tightly, and a left display screen is not tightly connected with a right display screen, which resulting in poor display effect and other hazards.

Figure 3:
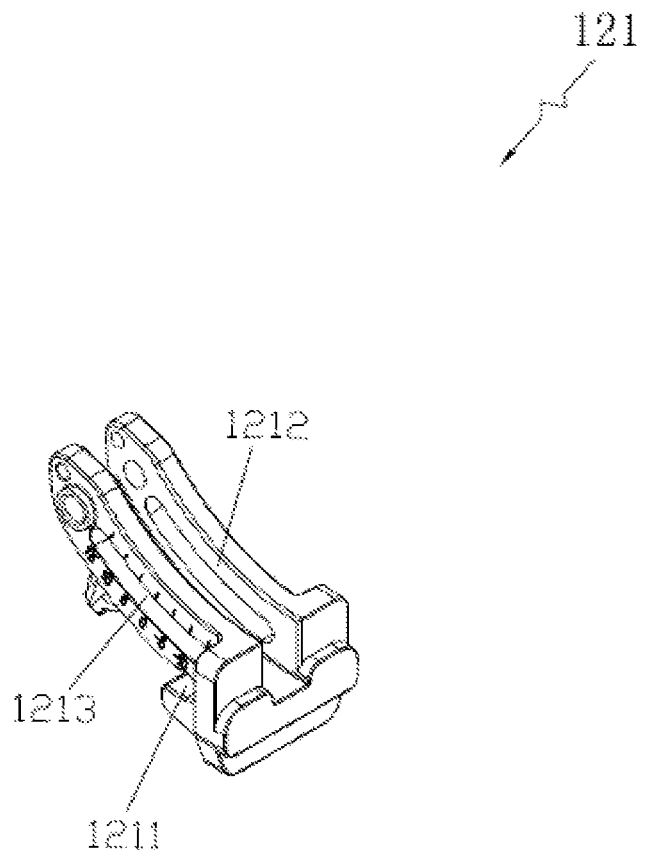
FIG. 3 is an enlarged schematic view of the cover according to FIG. 1, shown from another angle.

As shown in FIG. 2 and FIG. 3, the arc-shaped sliding shaft 122 includes a mounting part 1221 including a screw mounting hole 12 and an arc-shaped rod 1222. The mounting part 1221 is connected with one end of the arc-shaped rod 1222, and the mounting part 1221 is fastened on the first adjacent LED box through a screw structure (not shown). The arc-shaped cover 121 includes an arc-shaped sliding groove 1212 for receiving the arc-shaped rod 1222. And two sides of the arc-shaped sliding groove includes one arc-shaped and graduated groove 1213. And the arc-shaped rod 1222 includes a connecting rod 13 at an end of the arc-shaped rod 1222 adjacent to the mounting part 1221, and the connecting rod 13 is slidably clamped and fit in two arc-shaped and graduated grooves 1213. Thus, the adjustment angle of the arc-shaped rod 1222 is directly read out by sliding the connecting rod 13 on the two arc-shaped and graduated grooves 1213 to adjust the angle of the arc-shaped rod 1222 quickly.

In addition, a graduated positioning button assembly 14 is arranged on the outside of arc-shaped cover 121. And one side of the arc-shaped rod 1222 facing the arc-shaped sliding groove is arranged with a plurality of graduated positioning holes 15, the graduated positioning button assembly 14 is clamped and fit in corresponding graduated positioning hole 15 to position the arc-shaped rod 1222 with a special angle. The adjusting mechanism includes a graduated positioning screw assembly 16 arranged at an outside of the arc-shaped cover 121. And the arc-shaped rod 1222 includes an arc-shaped groove 17, and the graduated positioning screw assembly 16 is clamped and fit in the arc-shaped groove 17 for locking the arc-shaped rod. Specifically, the graduated groove 1213 includes seven graduations of −15°, −10°, −5°, 0°, 5°, 10° and 15°, which represents that the arc-shaped rod 1222 can be adjusted along the arc-shaped sliding groove 1212 to have seven arc angles from −15° to 15°. Correspondingly, the side of the arc-shaped rod 1222 facing the arc-shaped sliding groove is arranged with seven graduated positioning holes 15 corresponding one-to-one to the seven graduations above-mentioned. After the arc-shaped rod 1222 is adjusted to the required angle, the graduated positioning button assembly 14 is inserted into corresponding graduated positioning hole 15 to position the arc-shaped rod 1222 preliminarily. Finally, the graduated positioning screw assembly 16 is clamped and fit in the arc-shaped groove 17 for locking the arc-shaped rod 1222.

In the installation process of the LED display screen, the lock seat is fastened to a first LED box. The sliding shaft of the adjusting mechanism is fastened to a second LED box adjacent to the first LED box. Then the connecting assembly is configured to connect the lock seat with the cover under a control of the handle assembly. The cover is sleeving on the sliding shaft, and the sliding shaft is slidable in the cover in an arc track. Thus two adjacent LED panels can be fastened and installed together through the arc-shaped lock. Meanwhile, the handle assembly can prevent the handle from loosening due to the misoperation, so that the installation experience and safety factor are increased multiply.

The foregoing description merely depicts some preferred embodiments of the present application and therefore is not intended to limit the scope of the application. An equivalent structural or flow changes made by using the content of the specification and drawings of the present application, or any direct or indirect applications of the disclosure on any other related fields shall all fall in the scope of the application.

What is claimed is:

1. An arc-shaped lock, for locking a first LED box and a second LED box together, comprising:
    an adjusting mechanism comprising:
        a sliding shaft fastened to the first LED box, and
        a cover sleeving on the sliding shaft, the sliding shaft sliding in the cover in an arc track; and
    a fixing mechanism comprising:
        a lock seat fastened to the second LED box,
        a handle assembly, and
        a connecting assembly configured to connect the lock seat with the cover under a control of the handle assembly;
    wherein:
        the sliding shaft comprises:
            an arc-shaped rod, and
            a mounting part connected with one end of the arc-shaped rod;
        the cover comprises a positioning button assembly arranged on an outside of cover; and
        the arc-shaped rod is arranged with positioning holes, the positioning button assembly being clamped and fit in corresponding positioning hole.

2. The arc-shaped lock of claim 1, wherein the lock seat is fastened to the second LED box through a screw structure.

3. The arc-shaped lock of claim 2, wherein the handle assembly comprises:
    a handle, one end of the handle being rotatably connected with the lock seat; and
    a safety structure for locking the handle, and comprising an elastic clamping block arranged at one end of the handle adjacent to the lock seat, wherein the elastic clamping block is configured to lock the handle through an elastic reset effect.

4. The arc-shaped lock of claim 3, wherein:
    one end of the cover adjacent to the lock seat comprises an arc-shaped clamping groove; and
    one end of the connecting component is drivingly connected with one end of the handle, and the other end of the connecting component is clamped and fit in the arc-shaped clamping groove.

5. The arc-shaped lock of claim 4, wherein:
    when the elastic clamping block is unlock the handle, one end of the handle is enable to rotate around the lock seat, until the connecting assembly is clamped in the arc-shaped clamping groove.

6. The arc-shaped lock of claim 2, wherein the sliding shaft comprises:
    an arc-shaped rod, and
    a mounting part connected with one end of the arc-shaped rod, and fastened on the first LED box through a screw structure.

7. The arc-shaped lock of claim 6, wherein the cover comprises an arc-shaped sliding groove for receiving the arc-shaped rod.

8. The arc-shaped lock of claim 7, wherein:
    two sides of the arc-shaped sliding groove comprises one arc-shaped and graduated groove; and
    the arc-shaped rod comprises a connecting rod at an end of the arc-shaped rod adjacent to the mounting part, and the connecting rod is slidably clamped and fit in two arc-shaped and graduated grooves.

9. The arc-shaped lock of claim 6, wherein:
    the adjusting mechanism comprises a graduated positioning screw assembly arranged at an outside of the cover; and
    the arc-shaped rod comprises an arc-shaped groove, the graduated positioning screw assembly being clamped and fit in the arc-shaped groove for locking the arc-shaped rod.

10. The arc-shaped lock of claim 1, wherein the handle assembly comprises:
    a handle, one end of the handle being rotatably connected with the lock seat; and
    a safety structure for locking the handle, and comprising an elastic clamping block arranged at one end of the handle adjacent to the lock seat, wherein the elastic clamping block is configured to lock the handle through an elastic reset effect.

11. The arc-shaped lock of claim 10, wherein:
    one end of the cover adjacent to the lock seat comprises an arc-shaped clamping groove; and
    one end of the connecting component is drivingly connected with one end of the handle, and the other end of the connecting component is clamped and fit in the arc-shaped clamping groove.

12. The arc-shaped lock of claim 11, wherein:
    when the elastic clamping block is unlock the handle, one end of the handle is enable to rotate around the lock seat, until the connecting assembly is clamped in the arc-shaped clamping groove.

13. The arc-shaped lock of claim 1, wherein
    the mounting part is fastened on the first LED box through a screw structure.

14. The arc-shaped lock of claim 13, wherein the cover comprises an arc-shaped sliding groove for receiving the arc-shaped rod.

15. The arc-shaped lock of claim 14, wherein:
    two sides of the arc-shaped sliding groove comprises one arc-shaped and graduated groove; and
    the arc-shaped rod comprises a connecting rod at an end of the arc-shaped rod adjacent to the mounting part, and the connecting rod is slidably clamped and fit in two arc-shaped and graduated grooves.

16. The arc-shaped lock of claim 15, wherein the arc-shaped and graduated groove comprises seven graduations of −15°, −10°, −5°, 0°, 5°, 10° and 15°.

17. The arc-shaped lock of claim 13, wherein:
    the adjusting mechanism comprises a graduated positioning screw assembly arranged at an outside of the cover; and
    the arc-shaped rod comprises an arc-shaped groove, the graduated positioning screw assembly being clamped and fit in the arc-shaped groove for locking the arc-shaped rod.

18. The arc-shaped lock of claim 1, wherein:
    the sliding shaft comprises an arc-shaped rod; and
    the cover comprises an arc-shaped sliding groove for receiving the arc-shaped rod, one side of the arc-shaped rod facing the arc-shaped sliding groove being arranged with graduated positioning holes.

19. The arc-shaped lock of claim 18, wherein:
    the arc-shaped and graduated groove comprises seven graduations of −15°, −10°, −5°, 0°, 5°, 10° and 15°; and
    the side of the arc-shaped rod facing the arc-shaped sliding groove is arranged with seven graduated positioning holes corresponding one-to-one to the seven graduations.

* * * * *